(12) United States Patent
Cheng et al.

(10) Patent No.: US 11,947,813 B2
(45) Date of Patent: Apr. 2, 2024

(54) CONFIGURABLE MEMORY DIE CAPACITANCE

(71) Applicant: Micron Technology, Inc., Boise, ID (US)

(72) Inventors: Jingwei Cheng, Shanghai (CN); Cheng Zhang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 16/976,286

(22) PCT Filed: Aug. 29, 2019

(86) PCT No.: PCT/CN2019/103342
§ 371 (c)(1),
(2) Date: Aug. 27, 2020

(87) PCT Pub. No.: WO2021/035626
PCT Pub. Date: Mar. 4, 2021

(65) Prior Publication Data
US 2023/0118874 A1    Apr. 20, 2023

(51) Int. Cl.
*G06F 3/06* (2006.01)
*G06F 13/16* (2006.01)
*G11C 7/10* (2006.01)

(52) U.S. Cl.
CPC .......... *G06F 3/0629* (2013.01); *G06F 3/0679* (2013.01); *G06F 13/1668* (2013.01); *G11C 7/10* (2013.01)

(58) Field of Classification Search
CPC ....................................................... G11C 7/10
See application file for complete search history.

(56) References Cited

U.S. PATENT DOCUMENTS

| 6,344,763 B1 | 2/2002 | Aritomi et al. |
| 6,812,869 B1 | 11/2004 | Rahman et al. |

(Continued)

FOREIGN PATENT DOCUMENTS

| CN | 104299640 A | 1/2015 |
| CN | 109062860 A | 12/2018 |

(Continued)

OTHER PUBLICATIONS

IPO/TW, "Office Action," issued in connection with ROC (Taiwan) Patent Application No. 109131002, dated Aug. 20, 2021 (5 pages).

(Continued)

*Primary Examiner* — Douglas King
(74) *Attorney, Agent, or Firm* — Holland & Hart LLP

(57) ABSTRACT

Methods, systems, and devices for configurable memory die capacitance are described. A memory device may include a capacitive component, which may include one or more capacitors and associated switching components. The capacitive component may be coupled with an input/output (I/O) pad and an associated input buffer, and the one or more capacitors of the capacitive component may be selectively couplable with the I/O pad via the switching components. Switching components may be activated individually, in coordination, or not at all, such that one, multiple, or none of the capacitors may be coupled with the I/O pad. The capacitive component, I/O pad, and input buffer may be included in a same die of the memory device. In some cases, a configuration of the capacitive component may be based on signaling received from a host device.

29 Claims, 11 Drawing Sheets

(56) References Cited

U.S. PATENT DOCUMENTS

| | | |
|---|---|---|
| 8,502,342 B1 | 8/2013 | Ben |
| 9,767,889 B1 | 9/2017 | Powers et al. |
| 2002/0031041 A1* | 3/2002 | Kuge ............... G11C 11/4093 |
| | | 365/233.1 |
| 2008/0169851 A1 | 7/2008 | Liu |
| 2013/0258755 A1* | 10/2013 | Kollipara ............ G11C 5/04 |
| | | 365/149 |
| 2013/0265815 A1* | 10/2013 | Kim .................. G11C 17/16 |
| | | 365/96 |
| 2015/0162909 A1 | 6/2015 | Bhuiyan et al. |
| 2018/0136707 A1 | 5/2018 | Ha et al. |
| 2019/0252385 A1 | 8/2019 | Yudanov et al. |

FOREIGN PATENT DOCUMENTS

| | | |
|---|---|---|
| CN | 208623338 U | 3/2019 |
| JP | 08-335871 A | 12/1996 |
| JP | 2001-307480 A | 11/2001 |
| JP | 2016-505992 A | 2/2016 |
| KR | 10-2002-0011674 A | 2/2002 |
| KR | 10-0372636 B1 | 2/2003 |
| TW | 201832410 A | 9/2018 |

OTHER PUBLICATIONS

Japanese Patent Office, "Office Action," issued in connection with Japan Patent Application No. 2022-513055 dated Apr. 4, 2023 (17 pages) (9 pages of English Translation and 8 pages of Original Document).

"Method and Apparatus for Network Tuning Via Configurable Device Input Parametrics ED—Darl Kuhn", ip.Com, ip.com Inc, 2013, XP013159392.

European Patent Office, "Supplementary European search report," issued in connection with European Patent Application No. 19943304.6 dated Mar. 30, 2023 (10 pages).

International Search Report and Written Opinion received for PCT Patent Application No. PCT/CN2019/103342, dated May 27, 2020, 7 pages.

Office Action received for Taiwan Patent Application No. 109131002, dated Dec. 30, 2021, 6 pages (3 pages of English Translation and 3 pages of Original Document).

Taiwanese Patent Office, "Office Action," issued in connection with Taiwan Patent Application No. 111135328 dated Oct. 19, 2023 (22 pages) (9 pages of English Translation and 13 pages of Original Document).

* cited by examiner

CONFIGURABLE MEMORY DIE CAPACITANCE

CROSS REFERENCE

The present Application for Patent is a 371 national phase filing of International Patent Application No. PCT/CN2019/103342 by CHENG et al., entitled "CONFIGURABLE MEMORY DIE CAPACITANCE," filed Aug. 29, 2019, assigned to the assignee hereof, and expressly incorporated by reference herein.

BACKGROUND

The following relates generally to a system that includes at least one memory device and more specifically to configurable memory die capacitance.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Some systems may include one or more memory devices coupled with a host device, where the memory devices may provide data storage or other memory capabilities to the host device. In some cases, signaling between the host device and an associated memory device may experience interference or noise, which may degrade performance of the system.

DETAILED DESCRIPTION

Figure 1:
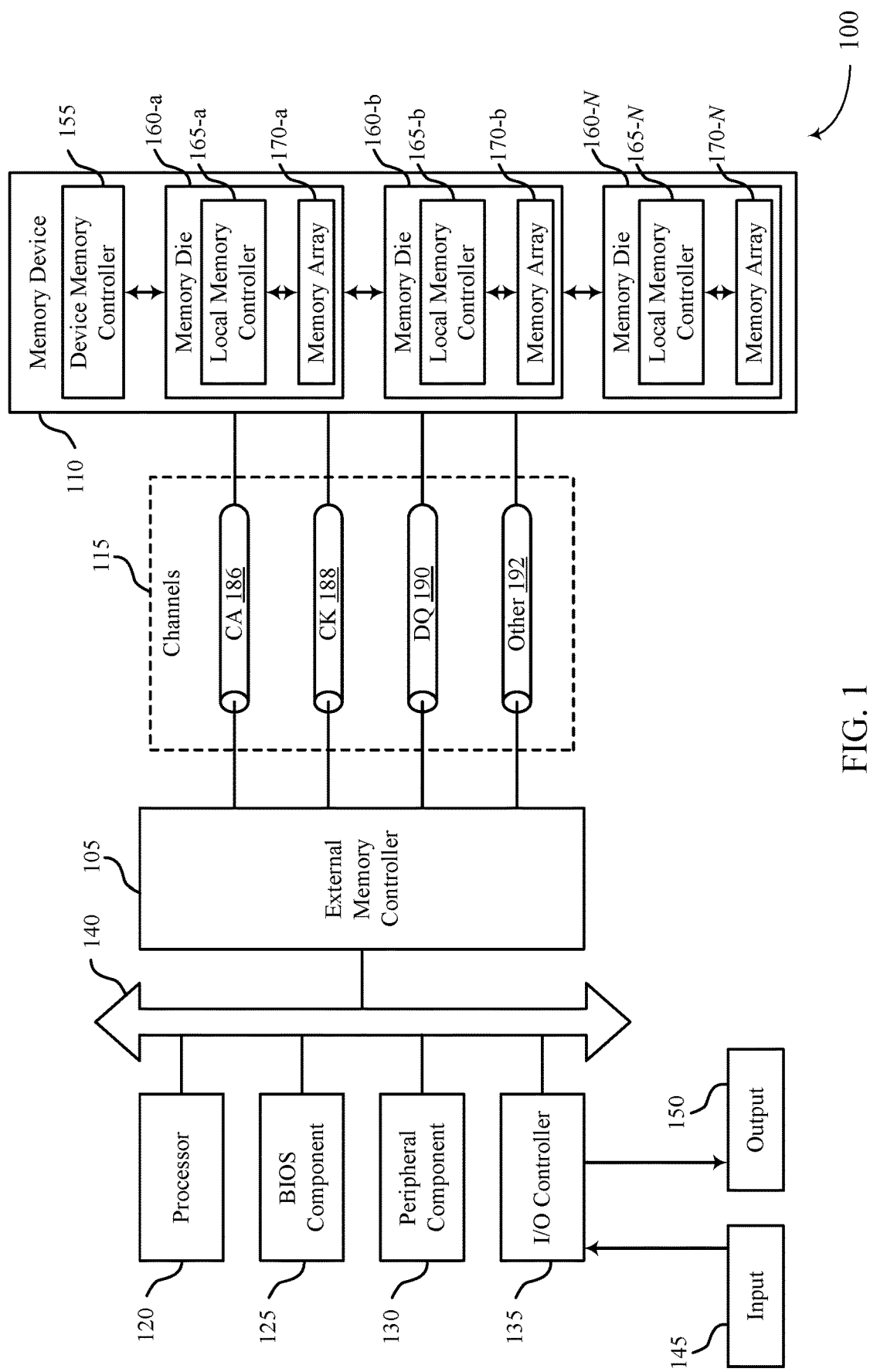
FIG. 1 illustrates an example of a system that supports configurable memory die capacitance in accordance with examples as disclosed herein.

A memory device may be configured to exchange signals with a host device, and, in some cases, signals exchanged between the memory device and the host device may experience interference (e.g., noise, crosstalk, and the like). For example, interference may arise due to reflections between the memory device and the host device, or due to other signals or reflections associated with other memory devices that may also be coupled with the host device (e.g., via a common bus with the memory device), or due to other causes that may be appreciated by those of ordinary skill in the art.

In some cases, increasing the slew rate (e.g., shrinking the rise and fall time) of signaling between the host device and the one or more memory devices may provide or be related to various benefits, such as increased data rates associated with higher speed (e.g., higher frequency) signaling. Increasing the slew rate may, however, increase amounts of interference within the system (e.g., due to higher frequency harmonics and increased capacitive crosstalk, or other causes that may be appreciated by those of ordinary skill in the art). Additionally or alternatively increasing the slew rate may decrease a voltage margin (e.g., for a data window for decoding signaling, which may also be referred to as an eye window) for interpreting signals at the memory device. Reducing the slew rate of signals as transmitted by the host device to the one or more memory devices may be undesirable or unsupported by the host device in some cases.

As described herein, however, signal reflections and other sources of interference as observed by a memory device may be mitigated by including a configurable (e.g., adjustable, tunable) capacitance at the memory device. The configurable capacitance may be included in a memory die within the memory device (e.g., may be a configurable on die capacitance), which may avoid the need for capacitors external to the device that may cause layout or other space concerns, among other benefits. The configurable capacitance at the memory device may be configured to have a capacitance that mitigates reflections and other sources of interference due, for example, to reflections of signals associated with other memory devices that are coupled with the memory device and the host device via a common bus (e.g., using a fly-by bus topology), such as a common command/address (CA) bus.

For example, a memory device may comprise a configurable capacitive component, the capacitance of which may be adjustable (tunable) in order to adjust or configure a capacitance associated with an I/O pad included in a memory die. The capacitive component may include one or more capacitors and one or more associated switching components (e.g., transistors). A switching component may be associated with one or more respective capacitors, and the one or more capacitors of the capacitive component may be selectively couplable with the I/O pad via the switching components. For example, one or more switching components may activate or switch on (close) and couple one or more capacitors with a conductive path between the I/O pad and the input buffer. Switching components may be activated individually, in coordination, or not at all, such that any one or more of the capacitors may be coupled with the I/O pad, or none of the capacitors may be coupled with the I/O pad. The capacitive component may be operable to adjust or to configure a capacitance associated with the I/O pad (e.g., an input capacitance of a memory die of the memory device). In some cases, the capacitive component may be coupled with the I/O pad and an associated input buffer included in the die (e.g., the capacitive component may be coupled with a conductive line between the I/O pad and the input buffer).

The memory device may identify a target configuration for the configurable capacitive component. For example, the host device may signal the memory device to indicate a target capacitance or related configuration information for the capacitive component. The memory device may receive the signaling from the host device and may configure the capacitive component based on the indicated target capacitance or configuration information. For example, a controller associated with the memory device may activate or deactivate one or more switching components in accordance with the indicated target capacitance or configuration. information. The adjusted capacitance of the I/O pad may adjust (e.g., decrease) a slew rate associated with signals received at the memory device and may reduce noise generated by reflected signals, which may increase the accuracy and reliability with which the memory device decodes signals received from the host device, among other benefits. Among other implementations, such enhanced accuracy and reliability of signaling may provide safety and other benefits in automotive or other safety-critical deployments.

Features of the disclosure are initially described in the context of a memory system and memory die as described with reference to FIGS. 1 and 2. Features of the disclosure are described in the context of a circuit diagram, a system topology, a memory device configuration, and a process flow, as described with reference to FIGS. 3-6. These and other features of the disclosure are further illustrated by and described with reference to an apparatus diagram and flowcharts that relate to configurable memory die capacitance as described with references to FIGS. 7-11.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, a vehicle, a vehicle controller, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dies 160 (e.g., memory chips) to support a desired or specified capacity for data storage. The memory device 110 including two or more memory dies may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, conductive lines may couple system components or may couple sub-components within a system component. For example, some conductive lines may comprise printed circuit board (PCB) traces or other conductive interconnects configured to carry signals between system components. As another example, some conductive lines may comprise bond wires or other conductive interconnects configured to carry signals between a memory die and another component of a device or the system 100. As another example, some conductive lines may comprise electrodes or other interconnects configured to carry signals within a memory die (e.g., from one component fabricated on the die to another component fabricated on the die).

The memory device 110 may include a device memory controller 155 and one or more memory dies 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. A memory die 160 may have one or more properties (e.g., a capacitance) that may be based on one or more elements (e.g., access lines, memory cells, circuitry, etc.) of the memory die 160.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dies 160 (e.g., memory die 160-*a*, memory die 160-*b*, and/or any quantity of memory dies 160-N). In a 3D memory device, a plurality of memory dies 160-N may be stacked on top of one another or next to one another. In some cases, memory dies 160-N in a 3D memory device may be referred to as decks, levels, layers, or dies. A 3D memory device may include any quantity of stacked memory dies 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dies 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins at external memory controller 105 and one or more pins at the memory device 110. A pin may be an example of and generically refer to any type of a conductive input or output point of a device of the system 100 (e.g., a ball of ball grid array (BGA)), and a pin may be configured to act as part of a channel.

In some cases, a pin may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dies 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more CA channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

The memory device 110 may be configured to communicate (e.g., transmit and receive signals) with a host device. In some cases, the memory device 110 may experience interference or noise when receiving signals from the host device. For example, signals from the host device may reflect off components of the memory device 110 or off one or more neighboring memory devices 110. The reflected signals may combine with the signals from the host device to the memory device 110 and may cause constructive and/or destructive interference. The interference experienced at the memory device 110 may depend on a signal slew rate, a system configuration or topology (e.g., bus topology, such as for a CA or DQ bus), circuitry or other components of the memory device 110, or the like.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information per symbol. Multi-symbol modulation schemes and symbols may alternatively be referred to as non-binary, multi-bit, or higher-order modulation schemes and symbols.

As described herein, a memory device 110 may be configured to transmit signals to and receive signals from a host device (e.g., external memory controller 105), and, in some cases, may experience interference or noise when receiving signals from the host device. For example, signals from the host device may have a high slew rate, which may contribute to increased levels of noise (e.g., via signal reflections on neighboring memory devices). In some cases, a capacitance of one or more neighboring memory devices 110 (not shown) may, at least partially, cause signal reflection. The host device may be configured to reduce the noise experienced by the memory device 110 by indicating a target capacitance or related configuration information associated with a configurable capacitive component of the memory device 110. The memory device 110 may be operable to adjust or configure a capacitance associated with the configurable capacitive component, and thus with an I/O pad of the memory device 110 to which the configurable capacitive component may be coupled. In some cases, the configurable capacitive component may include one or more capacitors and one or more associated switching components (e.g., transistors) that may selectively couple the one or more capacitors with the I/O pad. In some cases, the configured capacitance of the configurable capacitive component may reduce a slew rate of signaling from the host device to the memory device 110 (e.g., a slew rate at the memory device 110), and the reduced slew rate may reduce signal reflection and associated noise.

Figure 2:
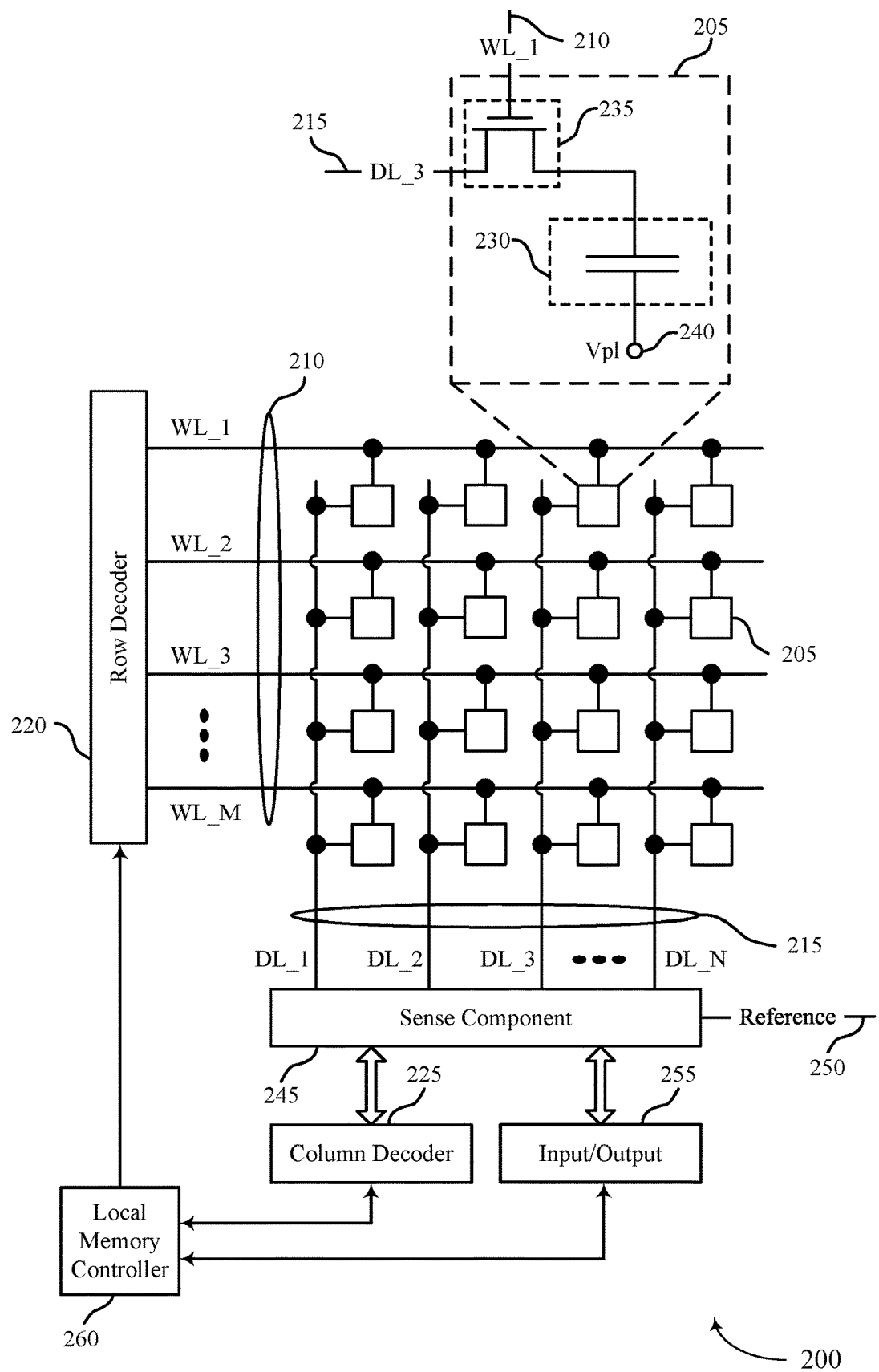
FIG. 2 illustrates an example of a memory die that supports configurable memory die capacitance in accordance with examples as disclosed herein.

FIG. 2 illustrates an example of a memory die 200 in accordance with examples as disclosed herein. The memory die 200 may be an example of the memory dies 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information at a time (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear (e.g., ferroelectric) dielectric materials may be employed.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 may be the cell plate reference voltage, such as Vpl, or may be ground, such as Vss. In some cases, the voltage source 240 may be an example of a plate line coupled with a plate line driver. The switching component 235 may be an example of a transistor or any other type of switch device that selectively establishes or de-establishes electronic communication between two components.

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

The sense component 245 may be configured to detect a state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge. During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of the memory cell 205 may be provided as an output of the sense component 245 (e.g., to an input/output 255), and may indicate the detected logic state to another component of a memory device 110 that includes the memory die 200, such as a device memory controller 155 (e.g., directly or using the local memory controller 260).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260. The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

The local memory controller 260 (or another controller included in the memory device) may configure one or more components associated with the memory die 200. For example, the controller may activate or deactivate one or more switching components of a configurable capacitive component of the memory die 200 based on a target capacitance or related configuration information, which may be indicated to the memory device or otherwise identified or determined by the memory device.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The target memory cell 205 may transfer a signal to the sense component 245 in response to biasing the access lines. The sense component 245 may amplify the signal. The local memory controller 260 may fire the sense component 245 (e.g., latch the sense component) and thereby compare the signal received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

A memory die 200 may be configured to transmit signals to and receive signals from a host device, and, in some cases, may experience interference or noise when receiving signals from the host device. For example, signals from the host device may have a higher slew rate, which may lead to higher levels of noise (e.g., via signal reflections on neighboring memory devices). In some cases, a capacitance of one or more neighboring memory dies 200 may, at least partially, cause signal reflection. The host device may be configured to reduce the noise experienced by the memory die 200 by indicating a target capacitance or a configuration associated with a capacitive component of the memory die 200. A capacitive component may be operable to adjust or configure a capacitance associated with an I/O pad of the memory die 200 and may include one or more capacitors and one or more associated switching components (e.g., transistors) that may selectively couple the one or more capacitors with the I/O pad. In some cases, a capacitance indicated by the target capacitance or the configuration of the capacitive component may reduce a slew rate of signaling from the host device to the memory die 200 (e.g., a slew rate at the memory die 200), and the reduced slew rate may reduce signal reflection and associated noise.

Figure 3:
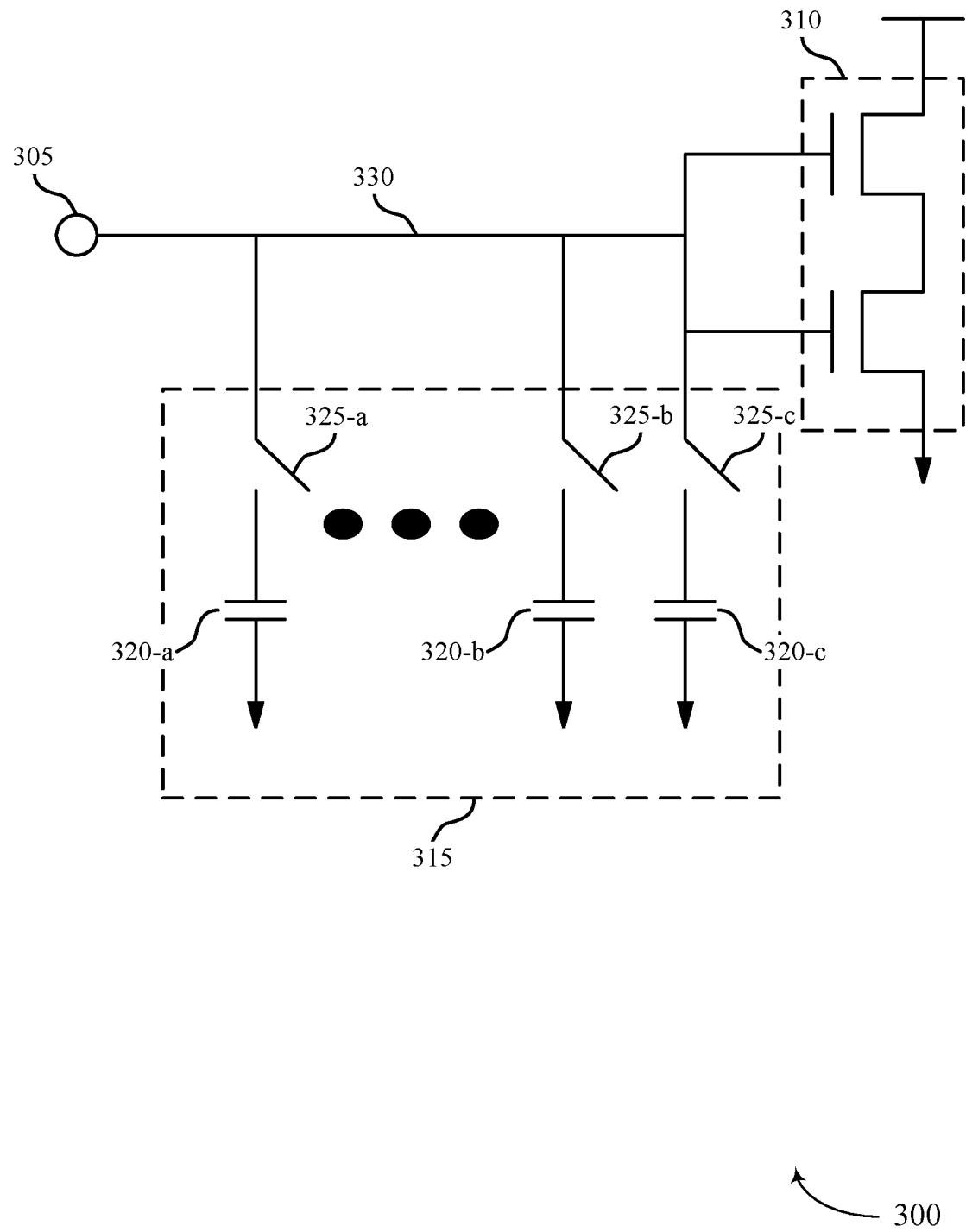
FIG. 3 illustrates an example of a circuit that supports configurable memory die capacitance in accordance with examples as disclosed herein.

FIG. 3 illustrates an example of a circuit 300 that supports configurable memory die capacitance in accordance with examples as disclosed herein. In some examples, circuit 300 may represent a portion of a memory device, where the memory device may include a memory die 200 as described with reference to FIG. 2. For example, a circuit represented by circuit 300 may include an I/O pad 305 The I/O pad 305 may be coupled with a bond wire or other interconnect, which may in turn couple the I/O pad 305 with a pin of the memory device, for example. Though described as a "pad," the claims and disclosure herein are not limited to any particular physical form factor of the I/O pad 305. Rather, an I/O pad such as the example of I/O pad 305 may refer to any conductive structure configured to received or transmit signals external to the memory die that includes the I/O pad.

The circuit represented by circuit 300 may also include one or more conductive paths 330 (e.g., traces, wires (such as bond wires), conductive lines/layers, etc.), and an input buffer 310. Conductive paths 330 may be examples of conductive lines described with reference to FIGS. 1 and 2. The circuit illustrated in circuit 300 may be configured to adjust or configure a capacitance of a memory die (e.g., by adjusting or configuring a capacitance of I/O pad 305).

For example, the circuit illustrated by circuit 300 may include one or more capacitive components 315, where a capacitive component 315 may be operable to adjust (e.g., configure) a capacitance associated with I/O pad 305. The capacitive component 315 may include a capacitor 320 (e.g., capacitor 320-*a*) and an associated switching component 325 (e.g., switching component 325-*a*). In some examples, the capacitive component may include multiple capacitors 320 (e.g., capacitors 320-*b*, 320-*b*, and 320-*c*) and multiple switching components (e.g., switching components 325-*a*, 325-*b*, and 325-*c*). A switching component 325 (e.g., a transistor) may be associated with one or more respective capacitors 320. For example, switching component 325-*a* may be associated with capacitor 320-*a*, switching component 325-*b* may be associated with capacitor 320-*b*, and so forth.

The capacitive component 315 may be coupled with the I/O pad 305, and thus one or more capacitors 320 of the capacitive component 315 may be selectively couplable with the I/O pad 305 via the switching components 325. In some cases, the capacitive component 315 may also be coupled with the input buffer 310, and thus one or more capacitors 320 of the capacitive component 315 may be selectively couplable with the input buffer 310 via the switching components 325. For example, one or more switching components 325 may activate or switch on (closed) and couple one or more capacitors 320 with a conductive path 330 between the I/O pad 305 and the input buffer 310. Switching components 325 may be activated individually, in coordination, or not at all, such that any one or more of the capacitors 320 may be coupled with the I/O pad 305, or none of the capacitors 320 may be coupled with the I/O pad 305. Because the capacitive component 315 may be coupled with the I/O pad 305, the capacitive component 315 may be operable to adjust or to configure a capacitance associated with the I/O pad 305 (e.g., an input capacitance of a memory die). As described above, the switching components 325 of the capacitive component 315 may be operable to couple a number (e.g., one, multiple, or none) of the capacitors 320 of the capacitive component 315 with the I/O pad 305. A host device or a memory device associated with the memory die may indicate the number of capacitors 320 to couple with the I/O pad 305 to adjust or configure the capacitance associated with the I/O pad 305.

In some cases, the host device may transmit signaling to the memory device indicating a target capacitance for one or more capacitive components 315 or indicating a configuration for one or more capacitive components 315 (e.g., indicating a number of capacitors 320 to couple with I/O pad 305). In a first example, the signaling from the host device may indicate for the memory device to store the target capacitance or related configuration information for the one or more capacitive components 315 in one or more mode registers of the memory device. In some cases, a mode register may include additional memory dedicated to storing a state of the one or more capacitive components 315 (e.g., a state of switching components 325 associated with the one or more capacitive components 315). For example, a mode register may store information (e.g., one or more logic values) indicating a number of switching components 325 to be closed or activated. Additionally or alternatively a mode register may store one or more logic values as a bitmap, where each bit of the bitmap may correspond to a switching component 325 of a capacitive component 315. As such, each bit of the bitmap may indicate whether the corresponding switching component 325 is to be activated (closed) or deactivated (open) (e.g., by indicating a logic 0 or a logic 1).

Accordingly, the memory device may store the target capacitance or related configuration information for the one or more capacitive components 315 in the mode register(s) and may use the stored target capacitance or related configuration information to configure the one or more capacitive components 315 (e.g., by activating and/or deactivating switching components 325) and thereby adjust a capacitance associated with the memory die (e.g., a capacitance associated with the I/O pad 305). For example, each time the memory device powers on, the memory device (e.g., a controller of the memory device) may access the mode register(s) and configure the one or more capacitive components 315 accordingly.

In a second example, the signaling from the host device may indicate or command a target capacitance or a configuration for one or more capacitive components 315 (e.g., without specifying for the memory device to store the associated information in the one or more mode registers). As such, the memory device may configure the one or more capacitive components 315 according to the signaling (e.g., by activating and/or deactivating switching components 325 directly in respond to the signaling). The memory device may adjust the capacitive component without storing information associated with the received indication to the one or more mode registers (and later reading the information from the one or more mode registers). In some cases, the memory device may maintain the indicated target capacitance or configuration for the one or more capacitive components 315 until receiving new signaling from the host device indicating a new target capacitance or new configuration. In some cases, the memory device may store the target capacitance or configuration for the one or more capacitive components 315 in a mode register when powering down, if the new signaling has not been received.

The target capacitance or configuration for the one or more capacitive components 315 may be based on one or more of a signal slew rate, a memory die capacitance (e.g., a parasitic capacitance or other capacitance other than that of the capacitive component 315), signal noise (e.g., reflection noise), or the like, or any combination thereof. In one example, a target capacitance or a configuration for the one or more capacitive components 315 may support a target slew rate. Similarly, a target capacitance or a configuration for the one or more capacitive components 315 may be configured to lower a noise level (e.g., noise reflected from neighboring memory devices) for signals between the host device and the memory device. A target capacitance or a configuration for the one or more capacitive components 315 may also be based on a parasitic capacitance of one or more components (e.g., a gate capacitance of a PMOS transistor and/or NMOS transistor of an I/O buffer 310) of a memory die. For example, the target capacitance or configuration may be based on a parasitic capacitance of a memory die, such that a capacitance of a capacitive component 315, together with the parasitic capacitance, may equal a target total capacitance. The target total capacitance may be based on a target slew rate or signal noise, as described above, and may additionally be based on memory device and/or host device simulation results or measurements.

A target memory die capacitance or a configuration for the one or more capacitive components 315 may also be based on a placement of the memory device, a placement of one or more associated (coupled) memory devices) or a placement of one or more memory dies of the memory device. For example, the placement of the memory device or one or more associated memory dies may affect one or more parasitic capacitances (e.g., and associated noise) associated with the memory device, or may affect one or more other signaling parameters. As such, a target memory die capacitance or a configuration for the one or more capacitive components may be based on the capacitive or signaling effects introduced by the placement of the memory device or one or more associated memory devices and dies. Additionally or alternatively, the target memory die capacitance or configuration may be based on signal routing and communications structures between the host device and the memory device. Each memory die of a memory device may, in some cases, have a different target capacitance or a different configuration for an associated capacitive component 315 (e.g., based on placement and/or routing). Each memory device coupled with a host device may also have a different target capacitance or a different configuration for associated capacitive component(s) 315.

For example, each memory device may have a target capacitance for a capacitive component 315 based on a location or placement of the memory device, and/or based on signal routing (e.g., relative to the host device or a termination impedance, such as in terms of the length of signal path (e.g., bus length) between he memory device and the host device or termination impedance). In one example, a host device may be coupled with two or more memory devices, and a first memory device closer to the host device may have a higher target capacitance (e.g., based on an associated configuration) for a capacitive component 315 than memory devices that are farther away from the host device than the first memory device (e.g., an additional 2 picofarads (pF)). Additionally or alternatively, a bus coupling the host with the two or more memory devices may include an impedance (e.g., a termination impedance, such as a termination resistor (RTT)) that may sink or cancel some transmission noise. Accordingly, a first memory device farther away from the impedance may have a higher target capacitance (e.g., based on an associated configuration) for a capacitive component 315 than memory devices that are closer to the impedance than the first memory device In one example, a memory die (e.g., a memory device including a memory die) may be configured to communicate (e.g., transmit and receive signals) with a host device and may experience interference or noise when receiving signals from the host device. For example, signals from the host device (e.g., CA signals) may have a smaller rising and/or falling time (higher slew rate), which may lead to (e.g., via signal reflections) higher levels of noise for neighboring memory devices. In some cases, a capacitance of one or more neighboring memory dies may, at least partially, cause signal reflection (e.g., due to printed circuit board (PCB) discontinuity). The host device may be configured to reduce the noise experienced by the memory die by indicating a target capacitance or a configuration to a capacitive component 315 of the memory die (e.g., by activating and/or deactivating switching components 325). In some cases, a capacitance indicated by the target capacitance or the configuration of the capacitive component 315 may reduce a slew rate of signaling from the host device to the memory die (e.g., a slew rate at the memory die), and the reduced slew rate may reduce signal reflection and associated noise.

The host device may signal the memory die to indicate the target capacitance or configuration of the capacitive component 315 (e.g., including an indication of whether to use a mode register). The memory die may receive the signaling from the host device and may configure the capacitive component 315 based on the indicated target capacitance or configuration. For example, a controller associated with the memory die may activate or deactivate one or more switching components 325 in accordance with the indicated target capacitance or configuration. The switching components 325 may couple or decouple one or more associated capacitors 320 with an I/O pad 305 of the memory die and thus may alter the capacitance of the capacitive component 315 and the I/O pad 305. The adjusted capacitance of the I/O pad 305 may adjust (e.g., decrease) the slew rate associated with signals received at the memory die and may reduce noise generated by reflected signals, which may increase memory device accuracy.

Figure 4:
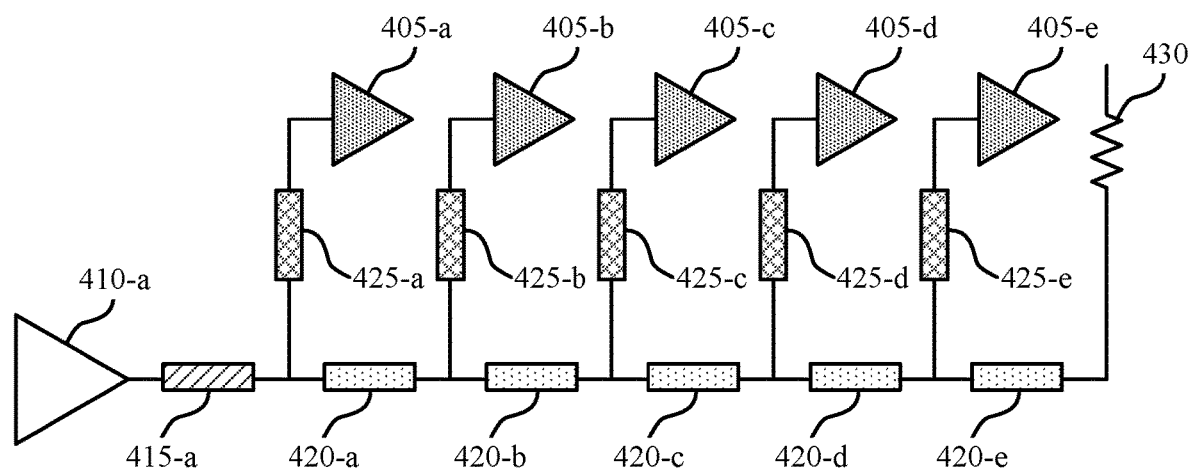
FIG. 4 illustrates an example of a bus topology that supports configurable memory die capacitance in accordance with examples as disclosed herein.

FIG. 4 illustrates an example of a bus topology 400 for memory devices that support configurable memory die capacitance in accordance with examples as disclosed herein. In some examples, one or more memory devices 405 may be coupled with a host device 410 (e.g., a system on a chip (SoC)) using bus topology 400. Each memory device 405 may include a memory die, which may be an example of a memory die described with reference to FIGS. 2 and 3. In some cases, a memory device 405 may include one memory die, and in other cases a memory device may include multiple memory dies. A memory die may include an I/O pad, which may be an example of an I/O pad described with reference to FIG. 3. The connections represented by bus topology 400 may also include one or more conductive paths (e.g., trace lines, wires, conductive lines/layers, etc.), which may be examples of signal paths or conductive lines described with reference to FIG. 1. The devices illustrated in bus topology 400 may be configured to adjust or configure a capacitance of a memory die (e.g., by adjusting or configuring a capacitance of an associated I/O pad).

For example, each memory device illustrated by bus topology 400 may include one or more capacitive components, where a capacitive component may be an example of a capacitive component 315 described with reference to FIG. 3. Each capacitive component may be selectively couplable with an associated I/O pad (e.g., via one or more switching components of the capacitive component) in order to adjust or configure a capacitance of the I/O pad (e.g., to a target capacitance). In some cases, a target capacitance of a memory die or associated I/O pad may be based on a configuration or topology of the one or more memory devices 405, with respect to each other and/or with respect to the host device 410 (e.g., may be based on the characteristics of the bus topology 400).

In one example, multiple memory devices 405 may be coupled with a host device 410-$a$ in a fly-by topology via one or more lines 415, 420, and/or 425, in which the multiple memory devices 405 may be coupled with the host device 405 via a common trunk line 415-$a$ and respective branch lines 425, where each branch line 425 couples a memory device 405 with the common trunk line 415-$a$. A trunk line 415-$a$ (e.g., a trunk PCB trace) may couple the host device 410-$a$ with the memory devices 405, and a length of trunk line 415-$a$ may depend on a distance between the host device 410-$a$ and the memory devices 405. In some cases, trunk line 415-$a$ may be a longest line coupling the host device 410-$a$ with the memory devices 405. Trace lines 420-$a$, 420-$b$, 420-$c$, 420-$d$, and 420-$e$ may couple branch lines 425 for memory devices 405 with each other and, in some cases, may represent PCB traces between the branch lines 425. A length associated with trace lines 420 may be based on a package size of the memory devices 405. Branch lines 425-$a$, 425-$b$, 425-$c$, 425-$d$, and 425-$e$ may represent PCB traces from trunk line 415-$a$ or the respective trace line 420 to a pin (e.g., a ball corresponding to a ball grid array (BGA)) of memory devices 405-$a$, 405-$b$, 405-$c$, 405-$d$, and 405-$e$, respectively. In some cases, branch lines 425 may be shorter than trace lines 420 or trunk line 415-$a$.

In some examples, lines 415, 420, and 425 may represent lines used for CA bus routing, and in some cases, multiple signals (e.g., 20 signals) may be carried over each line (e.g. each line illustrated in FIG. 4 may correspond to a group of parallel lines). Lines 415 420, and 425 may represent one-to-many connections between the host device 410-*a* and the memory devices 405, where one pin or pad on the host device 410-*a* may be coupled with a pin or pad on more than one of the memory devices 405. For example, one pin on host device 410-*a* may be coupled with a pin on each memory device 405.

A host device 410 may be coupled with multiple memory devices 405 to realize one or more benefits. For example, the host device 410 may be coupled with multiple memory devices 405 (e.g., four or five memory devices 405) in order to increase throughput, bandwidth, and memory density, for example, as part of automotive advanced driver assistance systems (ADAS), artificial intelligence (AI) applications, or other applications. In some cases, signals from the host device 410 (e.g., CA signals) to a memory device 405 may have a smaller rising and/or falling time, which may cause higher levels of noise to reflect off neighboring memory devices 405. In some cases, the level of noise at a memory device 405, which may impact a voltage margin associated with a data window for interpreting signaling, may fall below an input level of the memory device 405 and may cause timing errors at the memory device 405. In some cases, a termination impedance (e.g., RTT 430) may absorb or sink reflection noise, and as such, memory devices 405 located farther away from RTT 430 (e.g., memory device 405-*a* and/or 405-*b*) may experience more reflection noise from nearby memory devices 405.

As such, memory devices 405, or one or more dies of memory devices 405, may be configured with a capacitive component that may be operable to adjust or configure a capacitance of a memory die associated with the capacitive component (e.g., a capacitance of an I/O pad of the memory die). A capacitive component may reduce noise (e.g., reflection noise) at an associated memory device 405 by adjusting the capacitance of one or more memory dies of the memory device 405. For example, the host device 410 may be configured to reduce the noise experienced by one or more memory devices 405 by indicating a target capacitance or a configuration for a capacitive component of the memory device 405. In some cases, a resulting capacitance of the capacitive component (that is, a capacitance of the capacitive component as adjusted (tuned, configured) by the memory device 405 based on the indication) may reduce a slew rate of signals from the host device 410 to the memory device 405 (e.g., a slew rate at the memory device 405), and the reduced slew rate may reduce signal reflection and associated noise.

For example, a memory device farther away from RTT 430 (e.g., memory device 405-*a* and/or 405-*b*) may have a higher target capacitance (e.g., based on an associated configuration) for a capacitive component than memory devices 405 that are closer to RTT 430 (e.g., memory device 405-*c* and/or 405-*d*). Additionally or alternatively, a memory device closer to the host device 410 (e.g., memory device 405-*a* and/or 405-*b*) may have a higher target capacitance (e.g., based on an associated configuration) for a capacitive component than memory devices 405 that are farther from the host device 410 (e.g., memory device 405-*c* and/or 405-*d*).

The host device 410 may signal the memory device 405 to indicate the target capacitance or configuration of the capacitive component (e.g., an indication of configuration information for the memory device 405 to store in a mode register, one or more commands comprising configuration information). The memory device 405 may receive the signal from the host device 410 and may configure the capacitive component based on the indicated target capacitance or configuration. For example, a controller associated with the memory device 405 may activate (close) or deactivate (open) one or more switching components of a capacitive component in accordance with the indicated target capacitance or configuration. When activated, the switching components may couple one or more associated capacitors with an I/O pad of a memory die of the memory device 405, which may alter the capacitance of the I/O pad and the memory die (e.g., a memory die input capacitance). The adjusted capacitance of the I/O pad may configure (set) (e.g., decrease) the slew rate associated with signals received at the memory die, and at the memory device 405, and may reduce noise generated by reflected signals. Reduced noise may improve performance at the memory device 405, for example, by increasing signal accuracy and voltage margins.

Figure 5:
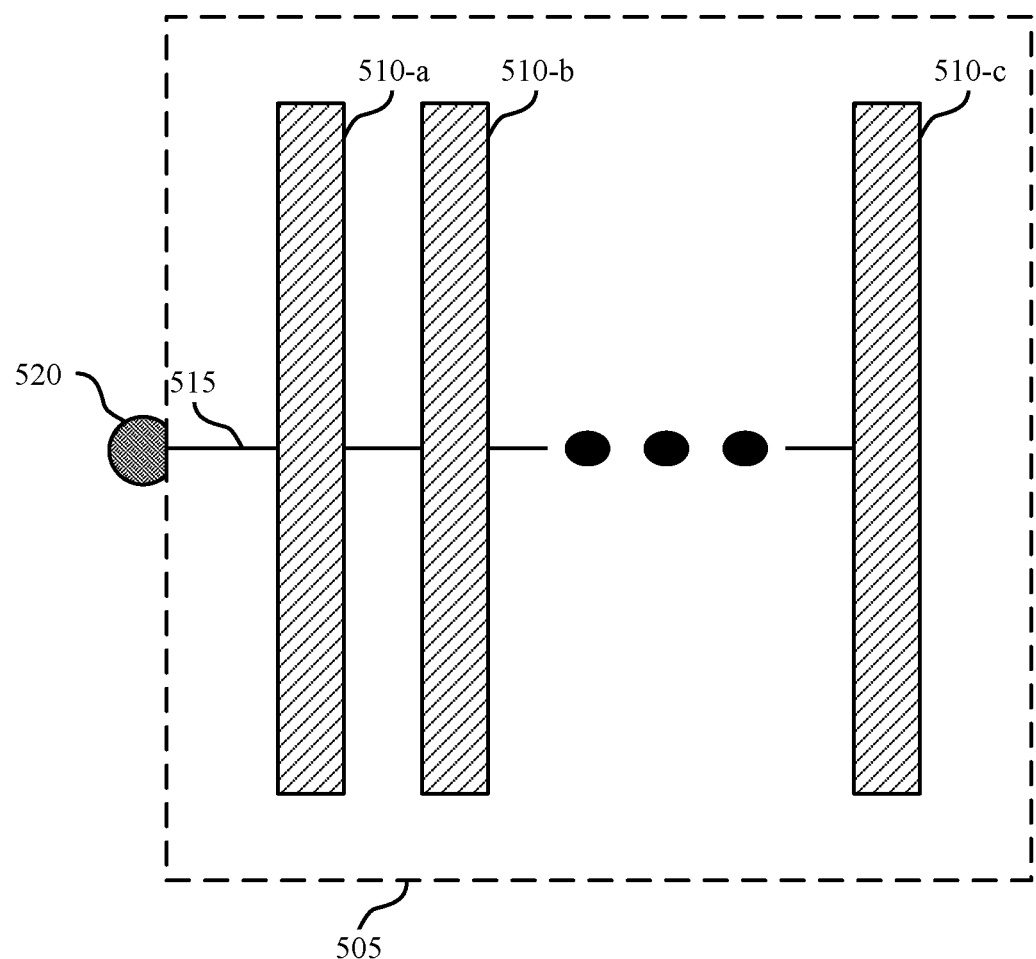
FIG. 5 illustrates an example of a memory device configuration that supports configurable memory die capacitance in accordance with examples as disclosed herein.

FIG. 5 illustrates an example of a memory device configuration 500 that supports configurable memory die capacitance in accordance with examples as disclosed herein. In some examples, memory device configuration 500 may be or include a memory device 505 that includes multiple memory dies 510, where a memory die 510 may be an example of a memory die described with reference to FIGS. 2-4 and memory device 505 may be an example of a memory device described with reference to FIGS. 3 and 4. A memory die 510 may include an I/O pad, which may be an example of an I/O pad described with reference to FIGS. 3 and 4. The memory device 505 may include one or more conductive paths 515 (e.g., trace lines, wires, conductive lines/layers, etc.), which may be examples of conductive lines or conductive paths described with reference to FIGS. 2 and 3. The memory device 505 may be operable to adjust (tune, set, configure) a capacitance of one or more memory dies 510 (e.g., by adjusting or configuring a capacitance of associated I/O pads).

For example, a memory die 510 of the memory device 505 may include one or more capacitive components, where a capacitive component may be an example of a capacitive component described with reference to FIGS. 3 and 4. Each capacitive component may be selectively couplable with an associated I/O pad (e.g., via one or more switching components of the capacitive component) in order to adjust or configure a capacitance of the I/O pad (e.g., to a target capacitance). In some cases, a target capacitance of a memory die 510 or associated I/O pad may be based on one or more characteristics of a configuration or topology of the one or more memory dies 510, with respect to each other, and/or with respect to the memory device 505. A target capacitance of a memory die 510 or associated I/O pad may additionally or alternatively be based on one or more characteristics of a configuration or topology of the memory device 505 with respect to one or more other memory devices 505 and/or a host device (e.g., a bus topology used to couple the host device with one or more memory devices 505).

In one example, the memory device 505 may include a pin 520 (e.g., a ball of a BGA, electrode, pin, pad, etc.) which may couple the memory device 505 to one or more other memory devices 505 and/or a host device (e.g., via one or more traces or other interconnects, such as described with reference to the example of FIG. 4). The pin 520 may be coupled with one or more conductive paths 515 of the memory device 505, where the one or more conductive paths 515 may couple the pin with one or more memory dies 510. For example, a conductive path 515 may couple pin 520 to one or more I/O pads corresponding to one or more memory dies 510. The conductive paths 515 may additionally or alternatively couple two or more memory dies 510. For example, a conductive path 515 may couple two I/O pads of two corresponding memory dies 510.

In some cases, signals from a host device (e.g., CA signals) to memory device 505 may have a smaller rising and/or falling time (e.g., a higher slew rate), which may cause higher levels of noise to reflect off neighboring memory devices 505. The level of noise at memory device 505, which may be referred to as or may impact a voltage margin or other signaling window, may fall below a threshold level (e.g., based on a reliability threshold) for the memory device 505 and may cause timing errors or other adverse effects at the memory device 505.

As such, one or more dies 510 of memory device 505 may be configured with a capacitive component that may be used to adjust or configure a capacitance of the corresponding memory die 510 (e.g., a capacitance of an I/O pad of the memory die 510). Additionally or alternatively, a capacitive component of one memory die 510 may be used to adjust or configure a capacitance of one or more other memory dies 510 (e.g., split an input capacitance among one or more other memory dies 510, be coupled with one or more other memory dies 510). For example, a capacitive component of memory die 510-a may be operable to adjust or configure a capacitance of memory dies 510-a and 510-b or memory dies 510-a, 510-b, and 510-c (e.g., the capacitive component may be coupled (e.g., selectively) with an I/O pin of memory dies 510-b and/or 510-c). One or more capacitive components may be operable to reduce noise (e.g., reflection noise) at memory device 505 by adjusting the capacitance of one or more memory dies 510 of the memory device 505. For example, a host device may be configured to reduce the noise experienced by memory device 505 by indicating a target capacitance or a configuration for a capacitive component of one or more memory dies 510 of the memory device 505. In some cases, a resulting capacitance associated with the capacitive component (e.g., a capacitance of the capacitive component as adjusted (tuned, configured) by the memory device 505 based on the indication) may reduce a slew rate of signals from the host device to the memory device 505 (e.g., a slew rate at the memory device 505), and the reduced slew rate may reduce signal reflection and associated noise.

In some cases, the host device may signal the memory device 505 to indicate the target capacitance or configuration of one or more capacitive components (e.g., an indication of configuration information for the memory device 505 to store in a mode register, one or more commands comprising configuration information). The memory device 505 may receive the signal from the host device and may configure the one or more capacitive components based on the indicated target capacitance or configuration. For example, a controller associated with the memory device 505 may activate (close) or deactivate (open) one or more switching components of a capacitive component in accordance with the indicated target capacitance or configuration. When activated, the switching components may couple one or more associated capacitors with one or more I/O pads of one or more memory dies 510 of the memory device 505, which may alter the capacitance of the one or more I/O pads and the one or more memory dies 510 (e.g., input capacitance). The adjusted capacitance of the one or more I/O pads may configure (set) (e.g., decrease) the slew rate associated with signals received at the one or more memory dies 510, and at the memory device 505, and may reduce noise generated by reflected signals. Reduced noise may improve device performance by increasing signaling accuracy and margins (e.g. voltage margins).

Figure 6:
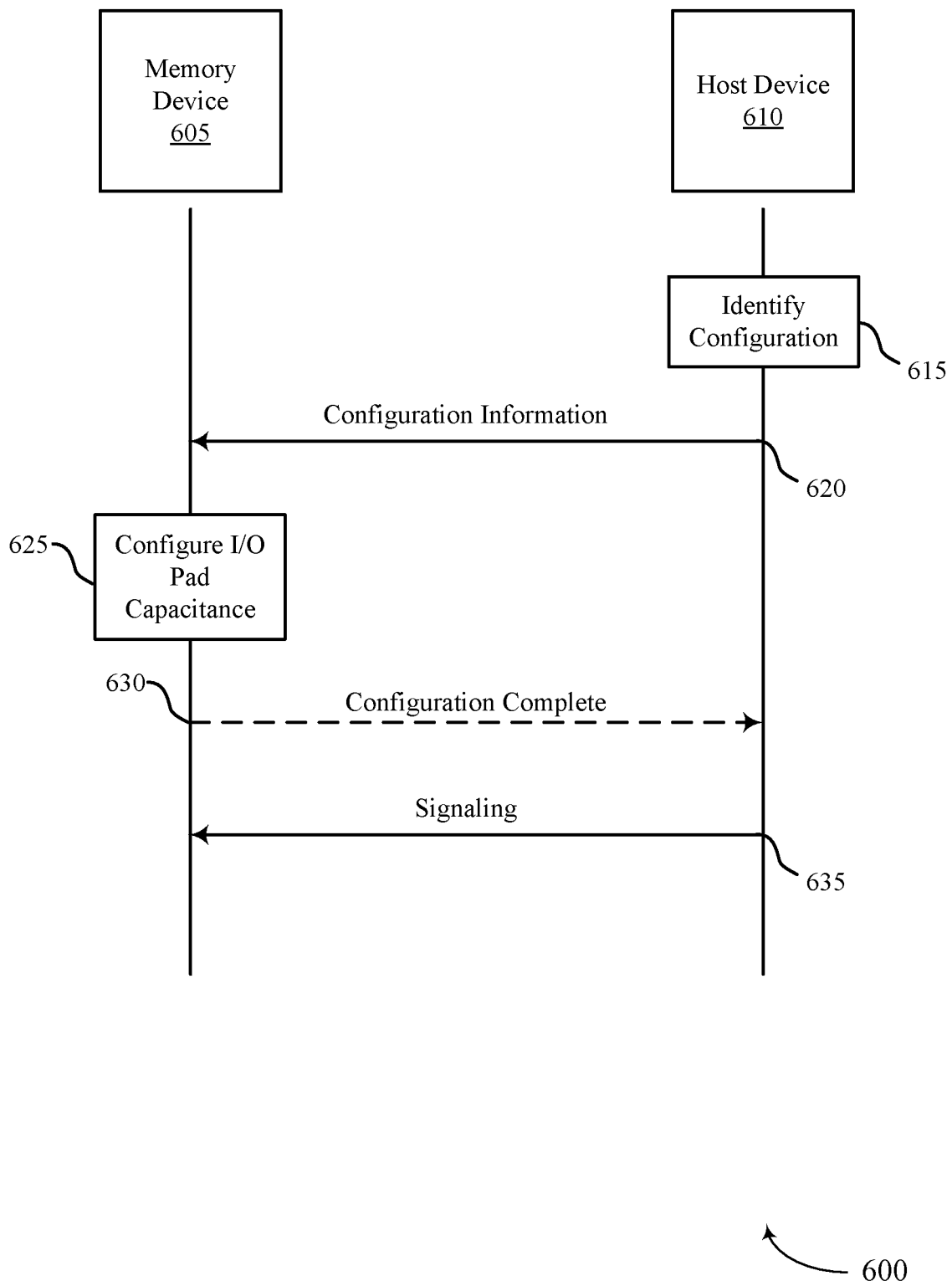
FIG. 6 illustrates an example of a process flow that supports configurable memory die capacitance in accordance with examples as disclosed herein.

FIG. 6 illustrates an example of a process flow 600 that supports configurable memory die capacitance in accordance with examples as disclosed herein. In some examples, process flow 600 may be implemented by a memory device 605 and a host device, which may be examples of a memory device and a host device described with reference to FIGS. 3-5. The memory device 605 may include one or more memory dies having one or more corresponding I/O pads, and the memory device 605 may be operable to adjust or configure a capacitance of the one or more memory dies (e.g., by adjusting or configuring a capacitance of associated I/O pads). For example, the host device 610 may indicate for the memory device 605 to configure or adjust the capacitance of the one or more memory dies.

In the following description of the process flow 600, the operations between the memory device 605 and the host device 610 may be transmitted in a different order than the order shown, or the operations performed by the host device 610 or the memory device 605 may be performed in different orders or at different times. Specific operations may also be left out of the process flow 600, or other operations may be added to the process flow 600. Although the host device 610 and the memory device 605 are shown performing the operations of process flow 600, some aspects of some operations may also be performed by another device.

At 615, the host device 610 may identify a target configuration of a capacitive component of the memory device 605 based on a target capacitance associated with an I/O pad of the memory device 605 (e.g., associated with a memory die of the memory device 605). In some cases, the host device 610 may identify target configurations for one or more capacitive components of the memory device 605 based on target capacitances associated with one or more I/O pads of the memory device 605 (e.g., associated with one or more memory dies of the memory device 605). The target capacitance may be based on a location of the memory device 605 with respect to the host device 610 or with respect to one or more impedances associated with a bus coupling the host device 610 and the memory device 605.

The host device may also identify a second target configuration of a second capacitive component of a second memory device based on a second target capacitance associated with a second I/O pad of the second memory device. The second target capacitance may be different than the target capacitance and may be based on a location of the second memory device with respect to the host device 610 or with respect to one or more impedances associated with a bus coupling the host device 610 and the second memory device (e.g., a bus coupling the host device 610, the memory device 605, and the second memory device).

At 620, the host device 610 may transmit configuration information to the memory device 605 based on identifying the target configuration(s). The host device 610 may also transmit, to the second memory device based on identifying the second target configuration, second configuration information indicating the second target configuration. In some examples, the configuration information (e.g., or the second configuration information) may include a target configuration of a capacitive component of the memory device 605 (e.g., or of the second memory device). Additionally or alternatively, the configuration information may include a target capacitance for a capacitive component of the memory device 605 (e.g., or of the second memory device). In some cases, the configuration information may include an indication of configuration information for the memory device 605 to store in a mode register or one or more commands including configuration information.

At 625, the memory device 605 may configure the capacitance(s) of the I/O pad(s) of the memory device 605 based on the configuration information. For example, as described with reference to FIGS. 3-5, the memory device 605 may include one or more capacitive components having adjustable capacitances, where the one or more capacitive components may be coupled with the one or more I/O pads of the memory device 605. In some cases, the memory device 605 may configure the capacitance of the I/O pad(s) by configuring the capacitive component(s) (e.g., according to the target configuration or the target capacitance). For example, a controller associated with the memory device 605 may activate (close) or deactivate (open) one or more switching components of a capacitive component in accordance with the configuration information. In some examples, the memory device 605 may store the received configuration information to one or more mode registers of the memory device 605 and may configure the capacitive component(s) based on storing the configuration information to the one or more mode registers.

In some cases, the memory device 605 may identify a target configuration of one or more capacitive components of the memory device 605 based on a target capacitance associated with one or more I/O pads of the memory device 605. As such, the memory device may configure the capacitance(s) of the I/O pad(s) of the memory device 605 based on the identified configuration.

At 630, the memory device 605 may, in some cases, transmit, to the host device 610, an indication that the capacitance of the I/O pad has been configured.

At 635, the host device 610 may transmit signaling to the memory device 605 via the I/O pad (e.g., after transmitting the configuration information and after the memory device 605 has configured the capacitance of the I/O pad). In some cases, a slew rate of the signaling (e.g., a slew rate of the signaling at the memory device 605) may be based on the configuration information (e.g., based on a configuration of the one or more capacitive components of the memory device 605). For example, a capacitance of the capacitive component as adjusted (tuned, configured) by the memory device 605 based on the indication may adjust (e.g., reduce) a slew rate of signals from the host device 610 to the memory device 605.

In some examples, the slew rate may be lowered by the configuration of the one or more capacitive components and the lower slew rate may lower reflection noise at the memory device 605. The reduction in noise at the memory device 605 may improve device performance by increasing signaling accuracy and thereby decreasing latency and improving reliability.

Figure 7:
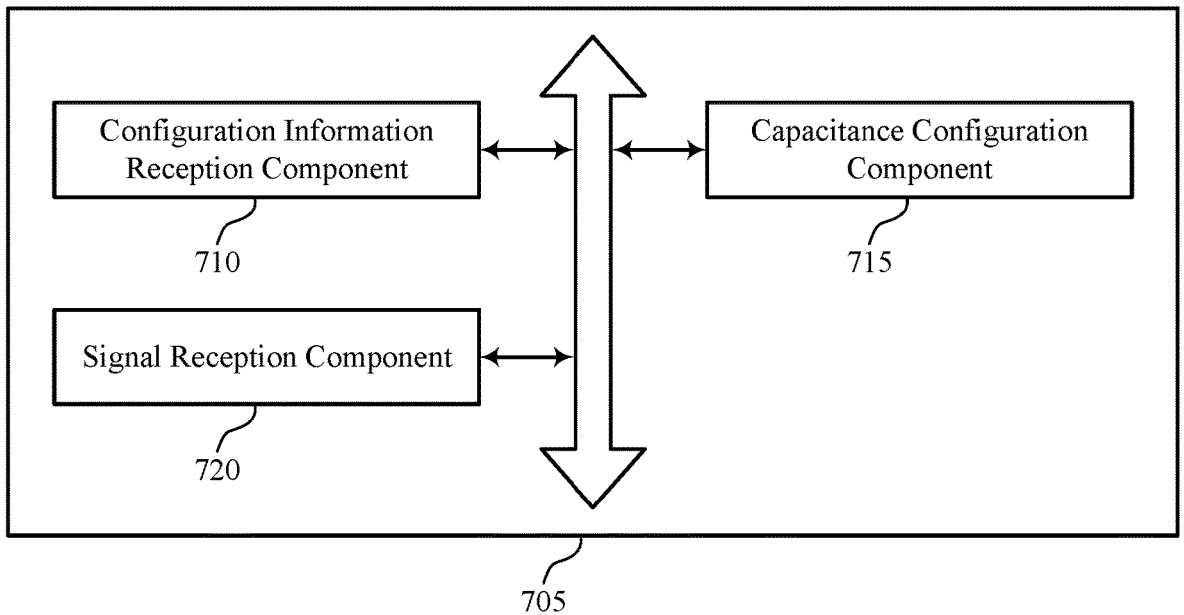
FIG. 7 shows a block diagram of a memory device that supports configurable memory die capacitance in accordance with aspects of the present disclosure.

FIG. 7 shows a block diagram 700 of a memory device 705 that supports configurable memory die capacitance in accordance with examples as disclosed herein. The memory device 705 may be an example of aspects of a memory device as described with reference to FIGS. 3-6. The memory device 705 may include a configuration information reception component 710, a capacitance configuration component 715, and a signal reception component 720. Each of these modules may communicate, directly or indirectly, with one another (e.g., via one or more buses).

The configuration information reception component 710 may receive, at a memory device, configuration information associated with a target capacitance of an I/O pad of the memory device. In some cases, the configuration information indicates a configuration of the capacitive component.

The capacitance configuration component 715 may configure, at the memory device, a capacitance of the I/O pad based on the configuration information. In some examples, configuring the capacitance of the I/O pad includes configuring the capacitive component. In some examples, the capacitance configuration component 715 may store the configuration information to one or more mode registers. In some examples, the capacitance configuration component 715 may configure the capacitive component based on storing the configuration information to the one or more mode registers. In some examples, the capacitance configuration component 715 may transmit, to the host device after configuring the capacitance of the I/O pad, an indication that the capacitance of the I/O pad has been configured. In some cases, the memory device includes a capacitive component having an adjustable capacitance and coupled with the I/O pad.

The signal reception component 720 may receive signaling from the host device via the I/O pad after configuring the capacitance of the I/O pad.

Figure 8:
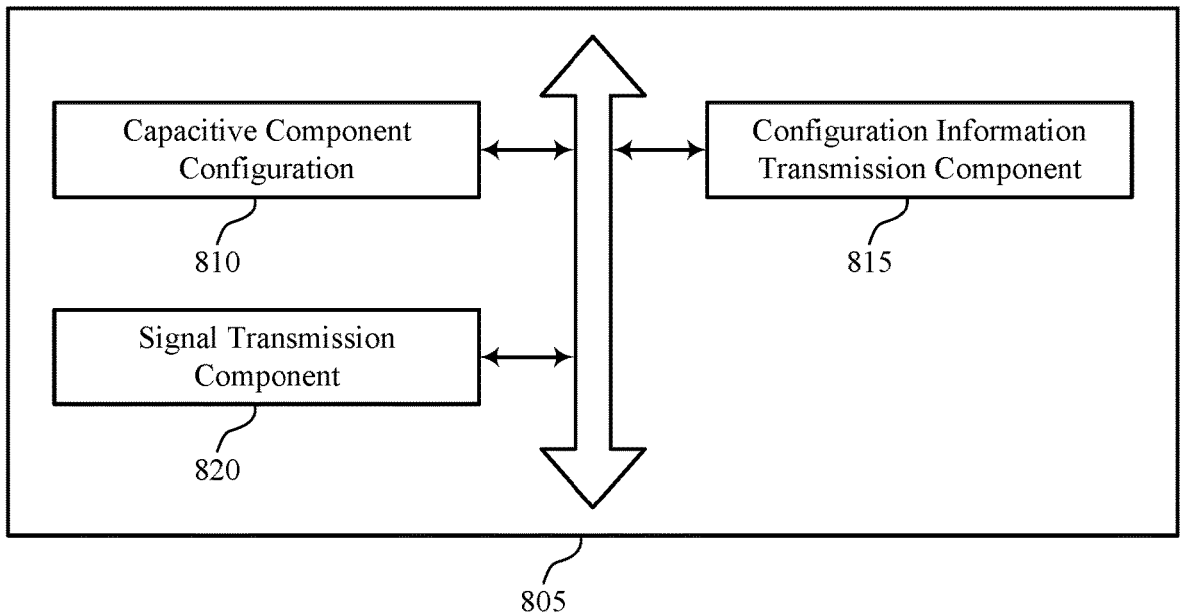
FIG. 8 shows a block diagram of a host device that supports configurable memory die capacitance in accordance with aspects of the present disclosure.

FIG. 8 shows a block diagram 800 of a host device 805 that supports configurable memory die capacitance in accordance with examples as disclosed herein. The host device 805 may be an example of aspects of a host device as described with reference to FIGS. 3-6. The host device 805 may include a capacitive configuration component 810, a configuration information transmission component 815, and a signal transmission component 820. Each of these modules may communicate, directly or indirectly, with one another (e.g., via one or more buses).

The capacitive configuration component 810 may identify a target configuration of a capacitive component of a memory device based on a target capacitance associated with an I/O pad of the memory device. In some examples, the capacitive configuration component 810 may identify a second target configuration of a second capacitive component of a second memory device based on a second target capacitance associated with a second I/O pad of the second memory device, where the second target capacitance may be different than the target capacitance.

The configuration information transmission component 815 may transmit, to the memory device based on identifying the target configuration, configuration information indicating the target configuration. In some examples, the configuration information transmission component 815 may transmit, to the second memory device based on identifying the second target configuration, second configuration information indicating the second target configuration.

The signal transmission component 820 may transmit signaling to the memory device via the I/O pad after transmitting the configuration information. In some cases, a slew rate of the signaling is based on the configuration information.

Figure 9:
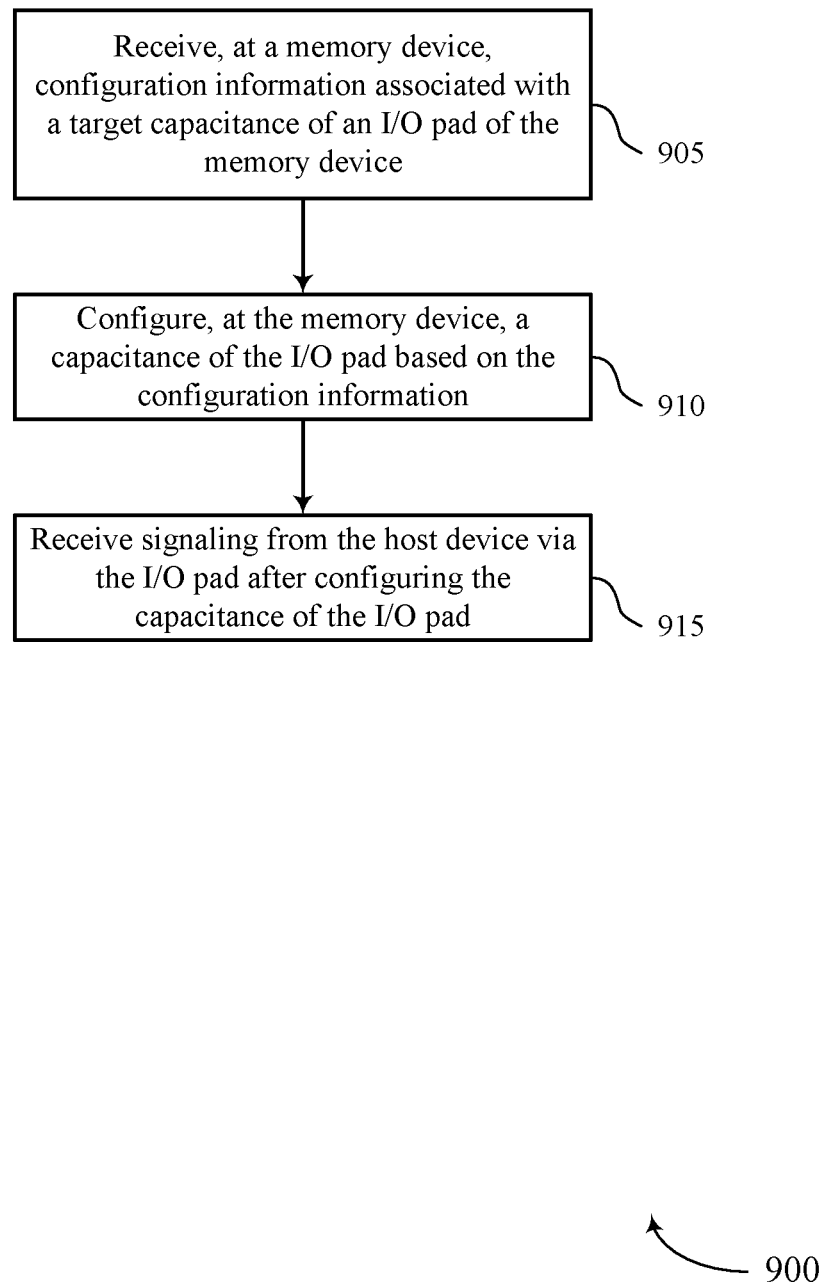
FIGS. 9 through 11 show flowcharts illustrating a method or methods that support configurable memory die capacitance in accordance with examples as disclosed herein.

FIG. 9 shows a flowchart illustrating a method or methods 900 that supports configurable memory die capacitance in accordance with aspects of the present disclosure. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may receive, at a memory device, configuration information associated with a target capacitance of an I/O pad of the memory device. The operations of 905 may be performed according to the methods described herein. In some examples, aspects of the operations of 905 may be performed by a configuration information reception component as described with reference to FIG. 7.

At 910, the memory device may configure, at the memory device, a capacitance of the I/O pad based on the configuration information. The operations of 910 may be performed according to the methods described herein. In some examples, aspects of the operations of 910 may be performed by a capacitance configuration component as described with reference to FIG. 7.

At 915, the memory device may receive signaling from the host device via the I/O pad after configuring the capacitance of the I/O pad. The operations of 915 may be performed according to the methods described herein. In some examples, aspects of the operations of 915 may be performed by a signal reception component as described with reference to FIG. 7.

In some examples, an apparatus as described herein may perform a method or methods, such as the method 900. The apparatus may include features, means, or instructions (e.g., a non-transitory computer-readable medium storing instructions executable by a processor) for receiving, at a memory device, configuration information associated with a target capacitance of an I/O pad of the memory device, configuring, at the memory device, a capacitance of the I/O pad based on the configuration information, and receiving signaling from the host device via the I/O pad after configuring the capacitance of the I/O pad. In some examples of the method 900 and the apparatus described herein, the memory device may include a capacitive component having an adjustable capacitance and coupled with the I/O pad, configuring the capacitance of the I/O pad may include configuring the capacitive component, and the configuration information may indicate a configuration of the capacitive component.

Some examples of the method 900 and the apparatus described herein may further include operations, features, means, or instructions for storing the configuration information to one or more mode registers, and configuring the capacitive component based on storing the configuration information to the one or more mode registers. Some examples of the method 900 and the apparatus described herein may further include operations, features, means, or instructions for transmitting, to the host device after configuring the capacitance of the I/O pad, an indication that the capacitance of the I/O pad may have been configured.

Figure 10:
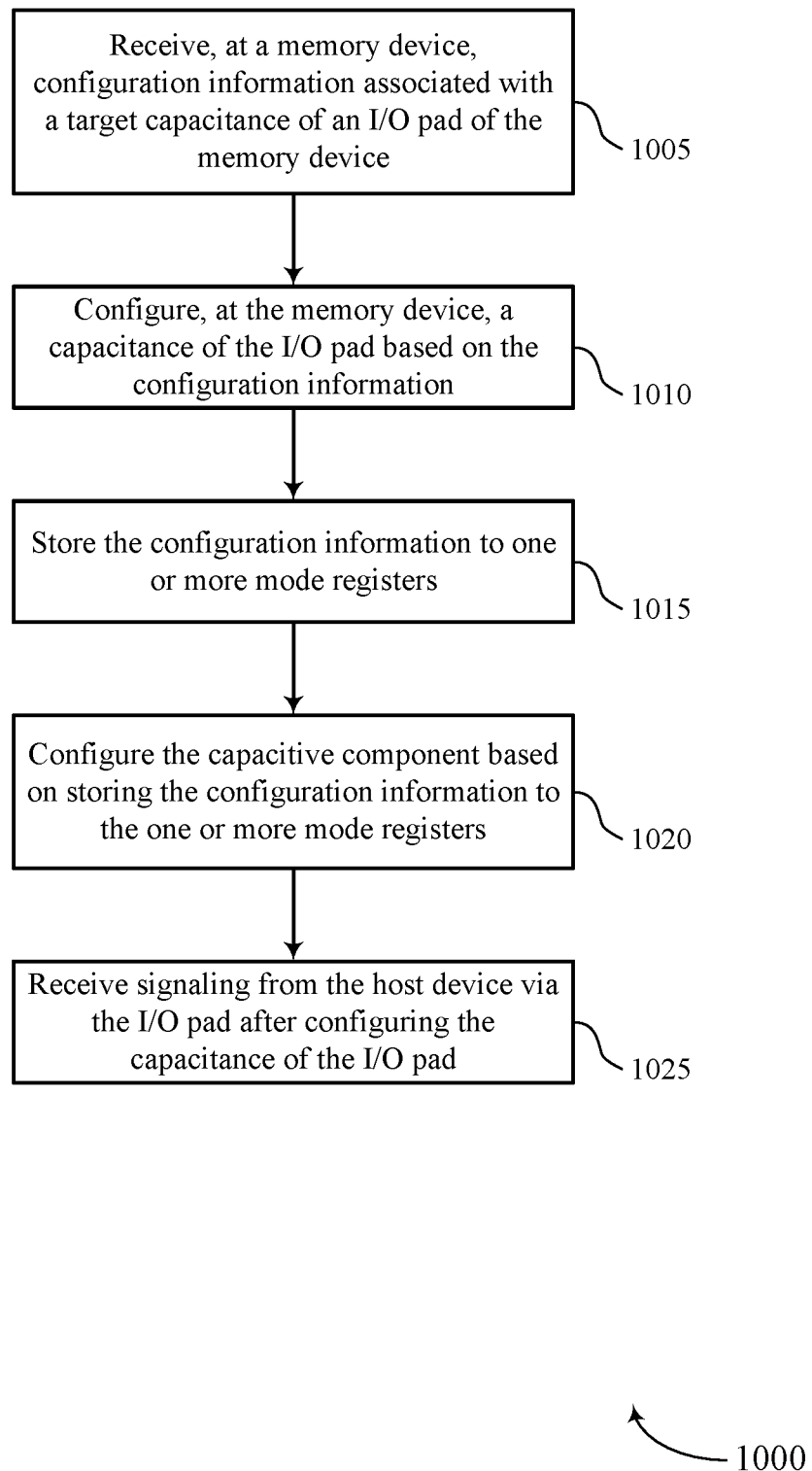

FIG. 10 shows a flowchart illustrating a method or methods 1000 that supports configurable memory die capacitance in accordance with aspects of the present disclosure. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may receive, at a memory device, configuration information associated with a target capacitance of an I/O pad of the memory device. The operations of 1005 may be performed according to the methods described herein. In some examples, aspects of the operations of 1005 may be performed by a configuration information reception component as described with reference to FIG. 7.

At 1010, the memory device may configure, at the memory device, a capacitance of the I/O pad based on the configuration information. The operations of 1010 may be performed according to the methods described herein. In some examples, aspects of the operations of 1010 may be performed by a capacitance configuration component as described with reference to FIG. 7.

At 1015, the memory device may store the configuration information to one or more mode registers. The operations of 1015 may be performed according to the methods described herein. In some examples, aspects of the operations of 1015 may be performed by a capacitance configuration component as described with reference to FIG. 7.

At 1020, the memory device may configure the capacitive component based on storing the configuration information to the one or more mode registers. The operations of 1020 may be performed according to the methods described herein. In some examples, aspects of the operations of 1020 may be performed by a capacitance configuration component as described with reference to FIG. 7.

At 1025, the memory device may receive signaling from the host device via the I/O pad after configuring the capacitance of the I/O pad. The operations of 1025 may be performed according to the methods described herein. In some examples, aspects of the operations of 1025 may be performed by a signal reception component as described with reference to FIG. 7.

Figure 11:
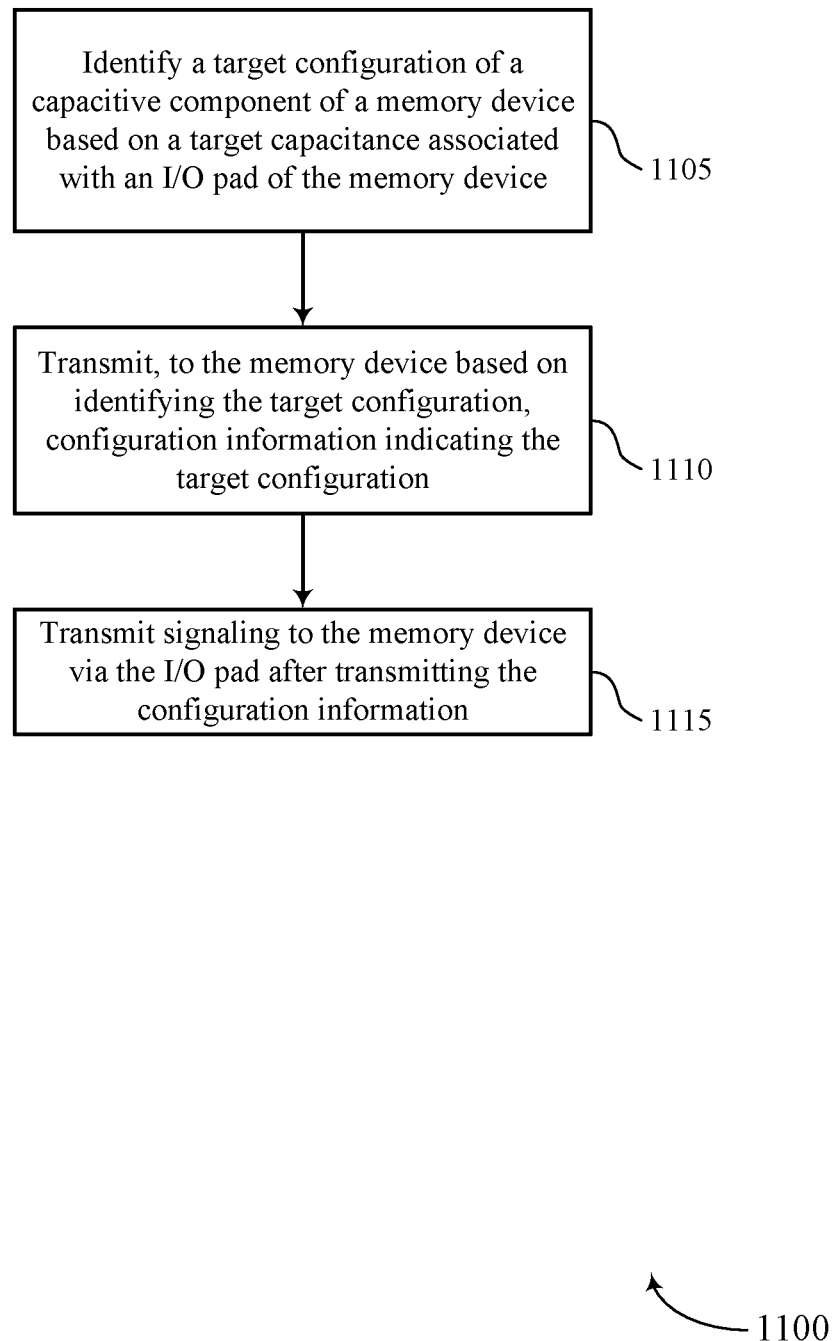

FIG. 11 shows a flowchart illustrating a method or methods 1100 that supports configurable memory die capacitance in accordance with aspects of the present disclosure. The operations of method 1100 may be implemented by a host device or its components as described herein. For example, the operations of method 1100 may be performed by a host device as described with reference to FIG. 8. In some examples, a host device may execute a set of instructions to control the functional elements of the host device to perform the described functions. Additionally or alternatively, a host device may perform aspects of the described functions using special-purpose hardware.

At 1105, the host device may identify a target configuration of a capacitive component of a memory device based on a target capacitance associated with an I/O pad of the memory device. The operations of 1105 may be performed according to the methods described herein. In some examples, aspects of the operations of 1105 may be performed by a capacitive component configuration as described with reference to FIG. 8.

At 1110, the host device may transmit, to the memory device based on identifying the target configuration, configuration information indicating the target configuration. The operations of 1110 may be performed according to the methods described herein. In some examples, aspects of the operations of 1110 may be performed by a configuration information transmission component as described with reference to FIG. 8.

At 1115, the host device may transmit signaling to the memory device via the I/O pad after transmitting the configuration information. The operations of 1115 may be performed according to the methods described herein. In some examples, aspects of the operations of 1115 may be performed by a signal transmission component as described with reference to FIG. 8.

In some examples, an apparatus as described herein may perform a method or methods, such as the method 1100. The apparatus may include features, means, or instructions (e.g., a non-transitory computer-readable medium storing instructions executable by a processor) for identifying a target configuration of a capacitive component of a memory device based on a target capacitance associated with an I/O pad of the memory device, transmitting, to the memory device based on identifying the target configuration, configuration information indicating the target configuration, and transmitting signaling to the memory device via the I/O pad after transmitting the configuration information. In some examples of the method 1100 and the apparatus described herein, a slew rate of the signaling may be based on the configuration information.

It should be noted that the methods described herein are possible implementations, and that the operations and the steps may be rearranged or otherwise modified and that other implementations are possible. Further, portions from two or more of the methods may be combined.

An apparatus is described. The apparatus may include a memory die that includes an I/O pad, an input buffer included in the memory die, the input buffer coupled with the I/O pad, and a capacitive component having an adjustable capacitance and included in the memory die, the capacitive component coupled with the I/O pad.

In some examples, the capacitive component includes a capacitor and a switching component operable to selectively couple the capacitor with the I/O pad. In some examples, the capacitive component includes a set of capacitors and a set of switching components, each respective switching component of the set operable to selectively couple a respective capacitor of the set with the I/O pad. Some examples of the apparatus may include a mode register operable to store one or more logic values, and a controller operable to cause the apparatus to configure the capacitive component to may have one of a set of capacitances supported by the capacitive component based on the one or more logic values.

In some examples, the capacitive component includes a set of switching components, and the one or more logic values indicate a quantity of the set of switching components for the controller to close. In some examples, the capacitive component includes a set of switching components, and the one or more logic values include a bitmap, each bit of the bitmap indicating whether the controller may be to open or close a respective one of the set of switching components.

Some examples of the apparatus may include a controller coupled with the capacitive component and operable to configure a slew rate of a signal received via the I/O pad based on configuring the adjustable capacitance of the capacitive component.

Some examples of the apparatus may include a second memory die that includes a second I/O pad and a second capacitive component, the second capacitive component having a second adjustable capacitance and coupled with the second I/O pad.

A system is described. The system may include a memory device and a host device coupled with the memory device. The memory device may include a memory die including an I/O pad and a capacitive component having an adjustable capacitance and coupled with the I/O pad. The host device may be operable to provide configuration information to the memory device, and the memory device may be operable to configure the adjustable capacitance of the capacitive component based on the configuration information.

In some examples, the capacitive component of the memory device includes one or more capacitors and one or more switching components, where each of the one or more switching components are operable to selectively couple a respective capacitor of the one or more capacitors with the I/O pad. In some examples, the host device is operable to provide the configuration information based on issuing, to the memory device, a command that indicates the configuration information. In some examples, a slew rate of a signal transmitted from the host device to the memory device is based on the adjustable capacitance of the capacitive component.

Some examples of the memory device may include a mode register, where the memory device is operable to configure the adjustable capacitance of the capacitive component based on one or more logic values stored in the mode register. In some examples, the host device is operable to provide the configuration information based on transmitting an indication of the one or more logic values to the memory device, and the memory device is operable to store the one or more logic values in the mode register based on the indication.

Some examples of the memory device may include an input buffer coupled with the I/O pad. Some examples of the memory device may include one or more additional memory dies each including a respective I/O pad. In some examples, the memory device is operable to couple the capacitive component with the respective I/O pad of at least one of the one or more additional memory dies. Some examples of the system may include one or more additional memory devices each including a respective memory die, the respective memory die including a respective I/O pad and a respective capacitive component. In some examples, the respective capacitive component may have a respective adjustable capacitance and may be coupled with the respective I/O pad. In some examples, a single I/O pad of the host device is coupled with a plurality of I/O pads that includes the I/O pad of the memory device and the respective I/O pad of each of the one or more additional memory devices.

In some examples of the system, the capacitive component of the memory device may be configured to have a first capacitance and a second capacitive component included in a second memory device of the one or more additional memory devices may be configured to have a second capacitance. In some examples, the memory device may be nearer the host device than the second memory device and the first capacitance may be greater than the second capacitance. In some examples of the system, the system may further include a termination impedance for a bus coupled with the host device, the memory device, and the second memory device, where the memory device may be farther from the termination impedance than the second memory device, and where the first capacitance may be greater than the second capacitance.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
a memory die that comprises an input/output (I/O) pad operable to couple with a host device;
an input buffer included in the memory die, the input buffer coupled with the I/O pad;
a capacitive component having an adjustable capacitance and included in the memory die, the capacitive component coupled with the I/O pad;
one or more mode registers; and
circuitry operable to cause the memory device to:
  receive an indication from the host device to store configuration information associated with the adjustable capacitance of the capacitive component to the one or more mode registers;
  store the configuration information to the one or more mode registers;
  configure the adjustable capacitance of the capacitive component based at least in part on the configuration information stored in the one or more mode registers; and
  receive signaling from the host device via the I/O pad based at least in part on configuring the capacitive component.

2. The memory device of claim 1, wherein the capacitive component comprises a capacitor and a switching component operable to selectively couple the capacitor with the I/O pad.

3. The memory device of claim 1, wherein the capacitive component comprises a plurality of capacitors and a plurality of switching components, each respective switching component of the plurality operable to selectively couple a respective capacitor of the plurality with the I/O pad.

4. The memory device of claim 1, wherein:
the capacitive component comprises a plurality of switching components; and
the configuration information indicates a quantity of the plurality of switching components for the circuitry to close.

5. The memory device of claim 1, wherein:
the capacitive component comprises a plurality of switching components; and
the configuration information comprises a bitmap, each bit of the bitmap indicating whether the circuitry is to open or close a respective one of the plurality of switching components.

6. The memory device of claim 1, wherein the circuitry is operable to cause the memory device to:
configure a slew rate of a signal received via the I/O pad based at least in part on configuring the adjustable capacitance of the capacitive component.

7. The memory device of claim 1, further comprising:
a second memory die that comprises a second I/O pad operable to couple with the host device and a second capacitive component, the second capacitive component having a second adjustable capacitance and coupled with the second I/O pad.

8. A system, comprising:
a memory device comprising:
  a memory die comprising an input/output (I/O) pad;
  a capacitive component having an adjustable capacitance and coupled with the I/O pad; and
  one or more mode registers; and
a host device coupled with the memory device, wherein:
  the host device is operable to provide, to the memory device, an indication to store configuration information to the one or more mode registers; and the memory device is operable to:
  store the configuration information to the one or more mode registers based at least in part on the indication;
  configure the adjustable capacitance of the capacitive component based at least in part on the configuration information stored in the one or more mode registers; and
  receive signaling from the host device via the I/O pad based at least in part on configuring the adjustable capacitance.

9. The system of claim 8, wherein the capacitive component of the memory device comprises one or more capacitors and one or more switching components, each of the one or more switching components operable to selectively couple a respective capacitor of the one or more capacitors with the I/O pad.

10. The system of claim 8, wherein the host device is operable to provide the configuration information based at least in part on issuing, to the memory device, a command that indicates the configuration information.

11. The system of claim 8, wherein:
  the host device is operable to provide the indication to store the configuration information based at least in part on transmitting an indication of one or more logic values to the memory device; and
  the memory device is operable to store the one or more logic values in the one or more mode registers based at least in part on the indication of the one or more logic values.

12. The system of claim 8, wherein the memory device further comprises an input buffer coupled with the I/O pad.

13. The system of claim 8, wherein the memory device further comprises one or more additional memory dies each comprising a respective I/O pad.

14. The system of claim 13, wherein the memory device is operable to couple the capacitive component with the respective I/O pad of at least one of the one or more additional memory dies.

15. The system of claim 8, further comprising:
  one or more additional memory devices each comprising a respective memory die, the respective memory die comprising a respective I/O pad and a respective capacitive component, the respective capacitive component having a respective adjustable capacitance and coupled with the respective I/O pad.

16. The system of claim 15, wherein:
  the capacitive component of the memory device is configured to have a first capacitance; and
  a second capacitive component included in a second memory device of the one or more additional memory devices is configured to have a second capacitance.

17. The system of claim 16, wherein:
  the memory device is nearer the host device than the second memory device; and
  the first capacitance is greater than the second capacitance.

18. The system of claim 16, further comprising:
  a termination impedance for a bus coupled with the host device, the memory device, and the second memory device, wherein the memory device is farther from the termination impedance than the second memory device, and wherein the first capacitance is greater than the second capacitance.

19. The system of claim 15, wherein a single I/O pad of the host device is coupled with a plurality of I/O pads that includes the I/O pad of the memory device and the respective I/O pad of each of the one or more additional memory devices.

20. The system of claim 8, wherein a slew rate of a signal transmitted from the host device to the memory device is based at least in part on the adjustable capacitance of the capacitive component.

21. A method comprising:
  receiving, at a memory device from a host device, an indication to store configuration information associated with a target capacitance of an input/output (I/O) pad of the memory device;
  storing the configuration information to one or more mode registers of the memory device based at least in part on the indication;
  configuring, at the memory device, a capacitance of the I/O pad based at least in part on the configuration information stored in the one or more mode registers; and
  receiving signaling from the host device via the I/O pad after configuring the capacitance of the I/O pad.

22. The method of claim 21, wherein:
  the memory device comprises a capacitive component having an adjustable capacitance and coupled with the I/O pad;
  configuring the capacitance of the I/O pad comprises configuring the capacitive component; and
  the configuration information indicates a configuration of the capacitive component.

23. The method of claim 22, further comprising:
  configuring the capacitive component based at least in part on the configuration information stored to the one or more mode registers.

24. The method of claim 21, further comprising:
  transmitting, to the host device after configuring the capacitance of the I/O pad, an indication that the capacitance of the I/O pad has been configured.

25. The method of claim 21, wherein receiving the signaling from the host device comprises:
  receiving, from the host device via the I/O pad after configuring the capacitance of the I/O pad, an access command associated with accessing the memory device.

26. A method comprising:
  identifying, at a host device coupled with a memory device, a target configuration of a capacitive component of the memory device based at least in part on a target capacitance associated with an input/output (I/O) pad of the memory device;
  transmitting, to the memory device based at least in part on identifying the target configuration, an indication to store configuration information indicating the target configuration to one or more mode registers of the memory device; and
  transmitting signaling to the memory device via the I/O pad after transmitting the configuration information.

27. The method of claim 26, further comprising:
  identifying, at the host device, a second target configuration of a second capacitive component of a second memory device coupled with the host device based at least in part on a second target capacitance associated with a second input/output (I/O) pad of the second memory device, wherein the second target capacitance is different than the target capacitance; and transmitting, to the second memory device based at least in part on identifying the second target configuration, second configuration information indicating the second target configuration.

28. The method of claim 26, wherein a slew rate of the signaling is based at least in part on the configuration information.

29. The method of claim 26, wherein transmitting the signaling to the memory device comprises:
transmitting, to the memory device via the I/O pad after transmitting the configuration information, an access command associated with accessing the memory device.

\* \* \* \* \*